(12) United States Patent
Barber et al.

(10) Patent No.: US 6,437,667 B1
(45) Date of Patent: Aug. 20, 2002

(54) METHOD OF TUNING THIN FILM RESONATOR FILTERS BY REMOVING OR ADDING PIEZOELECTRIC MATERIAL

(75) Inventors: Bradley Paul Barber, Chatham; Linus Albert Fetter, Morganville; George E. Rittenhouse, Holmdel; Michael George Zierdt, Belle Mead, all of NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/497,880

(22) Filed: Feb. 4, 2000

(51) Int. Cl.$^7$ .............................. H03H 9/54; H03H 9/56

(52) U.S. Cl. ...................... 333/188; 333/191; 310/312

(58) Field of Search ................... 333/186–192; 310/312, 320, 311, 321

(56) References Cited

U.S. PATENT DOCUMENTS

| | | | |
|---|---|---|---|
| 3,549,414 A | * 12/1970 | Curran et al. ............ 333/191 X |
| 4,502,932 A | 3/1985 | Kline et al. ............ 204/192 EC |
| 4,556,812 A | 12/1985 | Kline et al. ................. 310/324 |
| 4,719,383 A | 1/1988 | Wang et al. ................. 310/324 |
| 4,890,370 A | 1/1990 | Fukuda et al. ............. 29/25.35 |
| 4,988,957 A | 1/1991 | Thompson et al. ..... 331/107 A |
| 5,075,641 A | 12/1991 | Weber et al. ........... 331/108 C |
| 5,166,646 A | 11/1992 | Avanic et al. .......... 331/107 A |
| 5,231,327 A | * 7/1993 | Ketcham .................... 310/366 |
| 5,232,571 A | 8/1993 | Braymen ................ 204/192.22 |
| 5,263,259 A | 11/1993 | Cimador ..................... 33/41.4 |
| 5,283,458 A | 2/1994 | Stokes et al. ............... 257/416 |
| 5,294,898 A | 3/1994 | Dworsky et al. ........... 333/187 |
| 5,303,457 A | 4/1994 | Falkner, Jr. et al. ....... 29/25.35 |
| 5,334,960 A | 8/1994 | Penunuri .................... 333/193 |
| 5,348,617 A | 9/1994 | Braymen ..................... 156/644 |
| 5,367,308 A | 11/1994 | Weber ................. 343/700 MS |
| 5,373,268 A | 12/1994 | Dworsky .................... 333/187 |
| 5,381,385 A | 1/1995 | Greenstein. ................. 367/140 |
| 5,403,701 A | 4/1995 | Lum et al. .................. 430/315 |
| 5,404,628 A | 4/1995 | Ketcham .................... 29/25.35 |
| 5,407,525 A | * 4/1995 | Michel et al. .............. 156/627 |
| 5,438,554 A | 8/1995 | Seyed-Bolorforosh et al. ....... 367/140 |
| 5,446,306 A | 8/1995 | Stokes et al. ............... 257/416 |
| 5,552,655 A | 9/1996 | Stokes et al. ............... 310/330 |
| 5,587,620 A | 12/1996 | Ruby et al. ................. 310/346 |
| 5,596,239 A | 1/1997 | Dydyk ........................ 310/311 |
| 5,617,065 A | 4/1997 | Dydyk ........................ 333/186 |
| 5,630,949 A | * 5/1997 | Lakin ........................... 216/61 |
| 5,646,583 A | 7/1997 | Seabury et al. ............. 333/187 |
| 5,692,279 A | * 12/1997 | Mang et al. ............ 310/312 X |
| 5,698,928 A | 12/1997 | Mang et al. ................. 310/322 |

(List continued on next page.)

Primary Examiner—Robert Pascal
Assistant Examiner—Barbara Summons

(57) ABSTRACT

The present invention provides a method for tuning a thin film resonator (TFR) filter comprising a plurality of TFR components formed on a substrate. Each of the TFR components has a set of resonant frequencies that depend on material parameters and construction. TFR bandpass filter response for example can be produced by shifting the set of resonant frequencies in at least one of the series branch TFR components so as to establish the desired shape of the bandpass response and the desired performance of the filter. The shifting may be advantageously performed by removing piezoelectric material from the series branch TFR component, providing a TFR filter with bandwidth and attenuation advantages over that conventionally achieved by down-shifting resonant frequency sets of the shunt TFR components by adding metal material. Additionally, the above method can be used to produce a stopband TFR filter with a desired response by removing piezoelectric material from the shunt branch TFR component, to up-shift the shunt TFR components' set of resonant frequencies with respect to the series branch TFR components.

19 Claims, 5 Drawing Sheets

U.S. PATENT DOCUMENTS

| | | | |
|---|---|---|---|
| 5,702,775 A | 12/1997 | Anderson et al. | 428/1 |
| 5,714,917 A | 2/1998 | Ella | 332/144 |
| 5,760,663 A | 6/1998 | Pradal | 333/187 |
| 5,780,713 A | 7/1998 | Ruby | 73/1.82 |
| 5,789,845 A | 8/1998 | Wadaka et al. | 310/334 |
| 5,821,833 A | 10/1998 | Lakin | 333/187 |
| 5,850,166 A * | 12/1998 | Katoh et al. | 310/367 X |
| 5,853,601 A | 12/1998 | Krishaswamy et al. | 216/2 |
| 5,864,261 A | 1/1999 | Weber | 333/187 |
| 5,872,493 A | 2/1999 | Ella | 333/191 |
| 5,873,153 A | 2/1999 | Ruby et al. | 29/25.35 |
| 5,873,154 A | 2/1999 | Ylilammi et al. | 29/25.35 |
| 5,883,575 A | 3/1999 | Ruby et al. | 340/572.5 |
| 5,884,378 A | 3/1999 | Dydyk | 29/25.35 |
| 5,894,647 A * | 4/1999 | Lakin | 29/25.35 |
| 5,910,756 A | 6/1999 | Ella | 333/133 |
| 5,928,598 A | 7/1999 | Anderson et al. | 264/446 |
| 5,942,958 A | 8/1999 | Lakin | 333/189 |
| 5,963,856 A | 10/1999 | Kim | 455/307 |
| 6,051,907 A * | 4/2000 | Ylilammi | 310/312 |
| 6,060,818 A | 5/2000 | Ruby et al. | 310/363 |
| 6,081,171 A | 6/2000 | Ella | 333/189 |
| 6,087,198 A | 7/2000 | Panasik | 438/51 |
| 6,107,721 A * | 8/2000 | Lakin | 310/367 X |
| 6,127,768 A | 10/2000 | Stoner et al. | 310/313 A |
| 6,150,703 A | 11/2000 | Cushman et al. | 257/415 |
| 6,185,589 B1 | 2/2001 | Votipka | 707/517 |
| 6,198,208 B1 | 3/2001 | Yano et al. | 310/358 |
| 6,204,737 B1 | 3/2001 | Ella | 333/187 |
| 6,215,375 B1 | 4/2001 | Larson, III et al. | 333/187 |

* cited by examiner

METHOD OF TUNING THIN FILM RESONATOR FILTERS BY REMOVING OR ADDING PIEZOELECTRIC MATERIAL

FIELD OF THE INVENTION

The present invention relates to bulk acoustic resonator devices, more particularly to tuning thin film resonator filters.

DESCRIPTION OF THE RELATED ART

Bulk acoustic wave devices such as thin film resonators (hereinafter "TFR") are typically used in high-frequency frequency control and filtering applications ranging from several hundred megahertz (MHz) to several gigahertz (GHz). A TFR typically is comprised of a piezoelectric material interposed between two conductive electrodes, one of which can be formed on a support structure. The support structure can be a membrane formed by removal of material beneath it, or a plurality of alternating acoustic reflecting layers formed on a semiconductor substrate such as silicon or quartz, for example. The piezoelectric material is typically AlN, but may also be formed of ZnO or CdS amongst other piezoelectric material. The electrodes are formed from a conductive material, preferably of Al, but may be formed from other conductors as well. These films are deposited and lithographically patterned into their useful form in much the same way modern integrated circuits are made.

TFRs are often used in electronic signal filters, more particularly in TFR filter circuits applicable to a myriad of communication technologies. For example, TFR filter circuits may be employed in cellular, wireless and fiber-optic communications, as well as in computer or computer-related information-exchange or information-sharing systems.

The desire to render these increasingly complicated communication systems portable, even hand-held, places significant demands on filtering technology, particularly in the context of the increasingly crowded radio frequency spectrum. TFR filters must meet strict physical requirements which include: (a) being extremely robust, (b) being readily mass-produced and (c) being small while maintaining the required strict rejection and transmission characteristics. Restated, there is a simultaneous need for low passband insertion loss and for a large stopband attenuation in order to effectively clean up, for example, signals at the front-end of an RF radio. Some cellular phone applications for these TFR filters require passband widths up to 4% of the center frequency (for example, for a 2 GHz center frequency, this would be a bandwidth of about 80 MHz). This is not easily accomplished using common piezoelectrics such as AlN, and careful design and manufacture steps must be taken to keep filter bandwidths as wide as possible.

The piezoelectric material in TFR resonators converts electrical to mechanical energy and vice versa such that at its mechanical resonance frequency, the electrical behavior of the device abruptly changes. Electrical signals of particular frequencies easily pass thorough the resonators, while others will not be transmitted. These particular frequencies can be dictated by choosing resonator size and design. Resonators of certain sizes and design frequencies can be networked in appropriate combinations, such that they will impose desired filtering functions on signals passing through the network. A standard approach to designing filters out of resonators is to arrange them in a ladder configuration alternately in a series-shunt relationship. A series element in this sense carries signal from an input toward an output, whereas a shunt element provides an alternative path for the signal to ground. The transmission or blocking characteristics of both series and shunt elements affect the final signal reaching output from input, somewhat analogous to how branching of water pipes can affect the flow through the main water line.

Currently, the conventional way of designing TFR ladder filters is to design simple building blocks of TFR components having moderate selectivity, and then to concatenate these building blocks together (connected or linked up in a series or chain) to obtain a stronger filtering characteristic. In a simplified view, concatenation helps to achieve a larger stopband attenuation for the filter because each individual linked up section in the chain successively filters the signal more as it passes through the chain.

To make wide bandwidth filters from piezoelectric resonators, it is known that resonators of at least two differing frequencies are required. The difference in the frequencies will be similar to the required filter bandwidth. Numerous strategies are employed depending whether bandpass, bandstop, or any number of other filter shapes is required. Designs can be complicated and require more than a simple pair of frequencies. We shall illustrate an advantageous way to produce, in a batch fabricated manner similar to making integrated circuits, resonators on a single substrate of differing frequencies for use in any number of filtering applications. We shall describe the technique in the light of making a bandpass filter, but it will be realized the technique is applicable to making any number of filters requiring a multiplicity of differing frequency resonators.

FIG. 1 illustrates schematically illustrates this simple building block, commonly known as a T-Cell. Referring specifically to FIG. 1, a schematic of a T-Cell building block 100 includes three TFR components 110, 120 and 130. TFR components 110 and 120 comprise the "series arm" portion of the T-Cell block, being connected in series between an input port 115 and an output port 125 of T-Cell 100. TFR component 130 comprises the "shunt leg" portion of T-Cell 100, being connected in shunt between node 135 and ground. A TFR T-Cell itself may define a filter; although a TFR ladder filter typically has a plurality of these T-cells concatenated together.

FIGS. 2A–2C graphically illustrate how a bandpass filter response for bulk acoustic wave devices such as resonator filters are conventionally achieved. Each of the shunt and series TFR components 110, 120 and 130 in the schematic T-Cell of FIG. 1 has a set of characteristic frequencies: a "pole" frequency and a "zero" frequency. The terms refer to the magnitude of the impedance to current flow through the device; impedance is low at the zero and high at the pole. The series and shunt arms in a filter typically have zero and pole frequencies slightly shifted from each other. As will be explained further below, the current method of achieving an acceptable bandpass filter response has been to shift the frequencies of the shunt TFR component down in frequency.

Providing resonator components having desirable impedance characteristics is a necessary requirement for building a TFR-based filter. FIG. 2A illustrates a typical transmission response for a series TFR component of a TFR filter. Referring to FIG. 2A, a single, series-wired TFR component will have the voltage transmission response S21 (as shown in FIG. 2A, signal magnitude (y-axis in dB) as a function of frequency (z-axis GHz) shown at its output. FIG. 2A illustrates the following characteristics: the signal maximum (nearest the vertical zero, greatest transmission) occurs at about 1.90 GHz. This point is known as the resonator zero because of the nearly zero impedance to current flow. The point of least transmission is at about 1.94 GHz; this is the resonator's pole, where it has the highest impedance to the flow of electrical current. FIG. 2A illustrates the behavior of a device whose transmission of an electrical signal varies as a function of the frequency which is the basic definition of a filter. However, this single TFR component by itself does not have the characteristics desired in typical filters, like high rejection away from the pass band, or a flat pass band in which transmission is uniform.

FIG. 2B illustrates a typical response for a shunt TFR component of a TFR filter. The difference between FIGS. 2A and 2B is that in FIG. 2A, the signal moving from input to output must flow through the TFR, whereas in FIG. 2B, any signal flowing through the shunt TFR will not reach the output since it shunts to ground. Referring to FIG. 2B, a circuit executed in this manner has a minimum transmission at about 1.90 GHz, since the signal passes through the shunt resonator (at its frequency of lowest impedance) instead of proceeding to the output. At the pole frequency of the shunt TFR component, very little of the signal goes through the TFR (since it is at its frequency of highest impedance.) Consequently most of the signal is transmitted from input to output.

The T-cell structure of FIG. 1 is a combination of TFR resonators in series and shunt to form the T shape, thus the name. A resulting bandpass filter is formed where signals with frequencies away from the band are blocked, and signals in the band are passed. The TFR series and shunt behavior discussed in the explanations of FIGS. 2A and 2B can be used to make a bandpass filter. It is common in filter design to shift the shunt element's pole frequency to fall near the zero frequency of the series element so as to obtain near-uniform transmission in the center of the band. The resulting transmission behavior as illustrated in FIG. 2C FIG. 3 illustrates a cross-sectional view of a typical TFR component, which is comprised of a layer of piezoelectric material 210 interposed between top and bottom metal electrodes 205 and 215 on a substrate 220. The piezoelectric material 210 is preferably AlN, but may also be ZnO, or CdS amongst other materials. The metal electrodes 205 and 215 may be thin metal films of Al or other conductors. The substrate 220 may consist of a plurality of reflecting layers mounted on a silicon wafer, or may be formed as a membrane. What is fundamentally required from the reflecting layers or air interface of a membrane structure is to have a good reflection of acoustic energy created in the piezoelectric material, such that this energy does not leak out of the resonator, ultimately causing an undesired loss of signal.

The mechanical resonance frequency of a TFR resonator is determined by the time it takes the acoustic wave to make a trip from the top surface to the bottom, undergo a reflection, and return to the top. The thinner the device, the faster the wave returns. In a simplified view, the resonance, or sympathetic vibration, occurs at the frequency where a wave being input into the device constructively adds to the wave introduced in the previous cycle, but which has now returned to its original location. Thus the resonance frequency of the TFR is set by the thickness and properties (i.e., speed, density) of the films deposited. To create a bandpass filter which exhibits a response like in FIG. 2C from such resonators, the shunt and series TFRs are manufactured so as to resonate at different frequencies (typically but not necessarily all the series TFRs at one frequency, all the shunt TFRs at another). This is typically done by fabricating the shunt and series TFRs with different thicknesses, or more particularly by increasing the thickness of the shunt TFR. Conventionally, the shunt resonator's resonant frequency set (pole and zero) are reduced by adding a greater thickness of material to its top electrode. As shown in FIG. 3, for example, materials are added to the TFR component 200, such as a thin metal layer 216 added to top electrode 205 to reduce the resonant frequencies (pole and zero) of the TFR to be used as the shunt element of a filter.

However, the conventional method of adding a metal layer to the shunt electrode has some disadvantages. For example, added material which is not piezoelectric can detrimentally reduce the separation of the pole and zero frequencies; this may ultimately limit the maximum bandwidth of filters made from these structures. Also, metals are known to attenuate acoustic waves more than the insulating piezoelectric material, so it is desirable to minimize the fractional amount of metal in a resonator. Accordingly, what is needed is an alternative method of tuning a TFR filter that does not introduce these disadvantages.

SUMMARY OF THE INVENTION

The present invention provides a method for producing thin film resonator (TFR) filters formed from a plurality of TFR components coupled in series and shunt branches. Each of the plurality of TFR components has a set of resonant frequencies. A TFR bandpass filter can be produced by up-shifting the set of resonant frequencies in the series branch TFR components until the desired band shape is achieved. For example, this may be accomplished by removing material from the series branch TFR component, rather than by adding material to downshift the frequency of the shunt TFR components. Additionally, a TFR bandpass filter may be produced by down-shifting the set of resonant frequencies in the shunt branch TFR components until the desired band shape is achieved. Further, a TFR bandstop filter can be produced by up-shifting the set of resonant frequencies in the shunt branch TFR components until the desired stop band response is achieved. This can be accomplished by removing material from the shunt branch TFR components.

BRIEF DESCRIPTION OF THE DRAWINGS

The present invention will become fully understood from the detailed description given hereinbelow and the accompanying drawings, wherein like elements represent like reference numerals, which are given by way of illustration only and thus are not limitative of the invention and wherein.

DETAILED DESCRIPTION

An embodiment of the present invention is directed to a thin film resonator filter which, rather than down-shifting the shunt TFR components by the addition of material to the resonator surface, "up-shifts" the pole and zero frequencies of a series TFR component by removing material from these components. Reducing cavity size of the series TFR components provides a TFR filter having the same desirable filter response as that conventionally achieved by shifting the resonant frequencies of the shunt TFR components, without the disadvantages of bandwidth reduction by or excess acoustic loss in the extra added material.

Figure 4A:
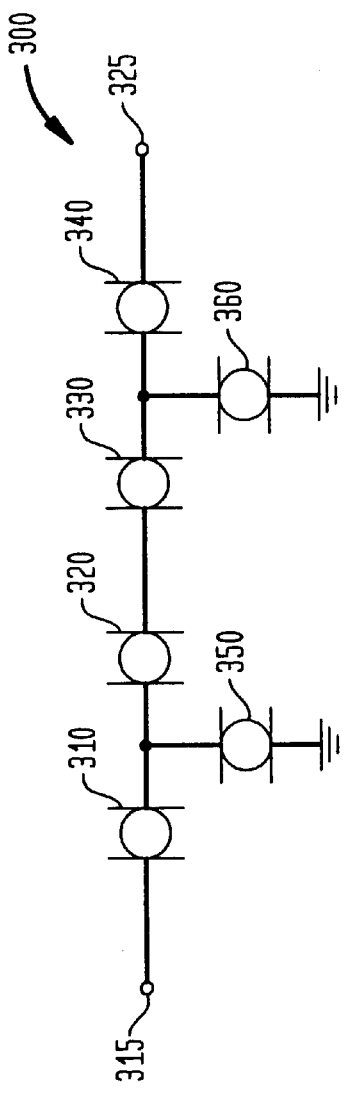
FIGS. 4A and 4B illustrate a TFR ladder filter in accordance with the invention.
Figure 4B:
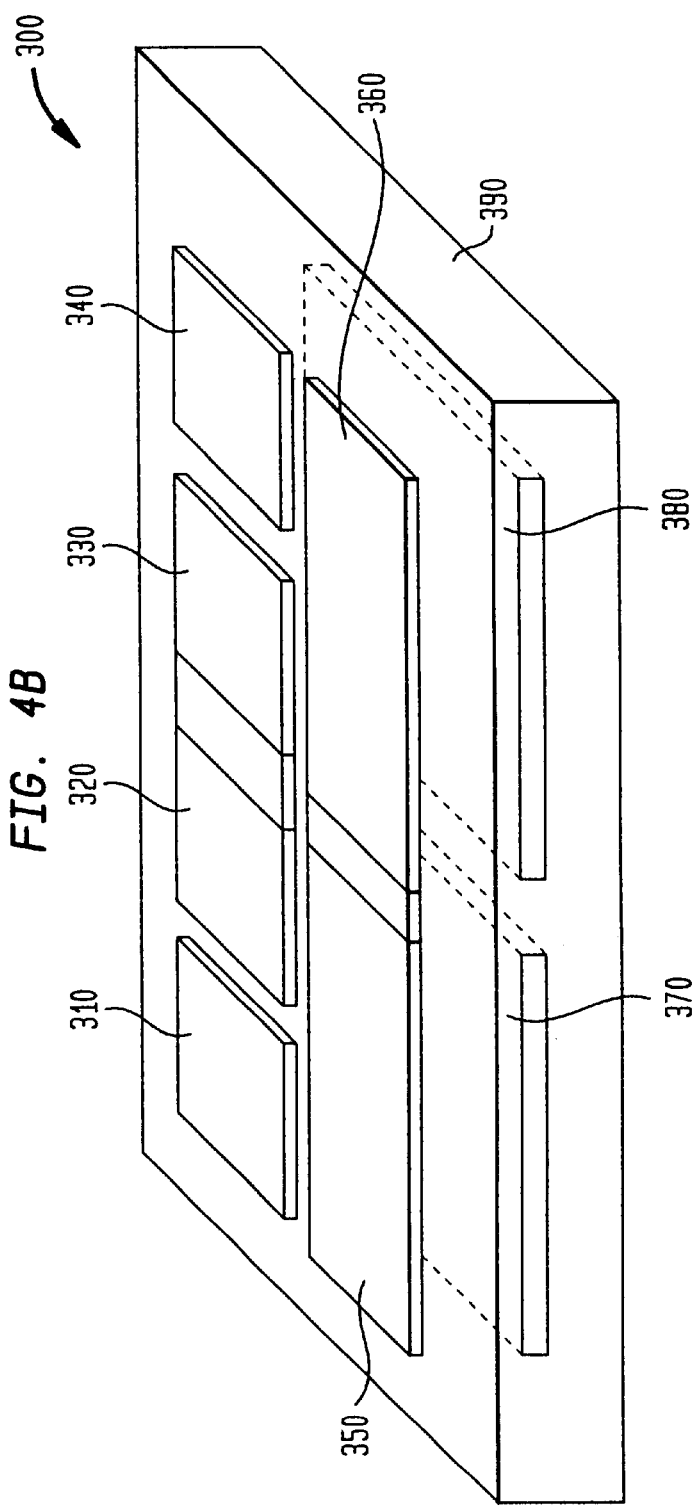

FIGS. 4A and 4B illustrate a TFR ladder filter in accordance with the invention. Referring to FIG. 4A, there is illustrated a plurality of series TFR components 310, 320, 330 and 340, which are arranged between input port 315 and output port 325 of the filter 300. Further, there is illustrated shunt TFR elements 350 and 360 connected between respective pairs of series TFR elements and grounds (not shown).

FIG. 4B illustrates physical representation of the schematic circuit shown in FIG. 4A. Referring to FIG. 4B, there is illustrated a die 390 on which various top electrodes corresponding to the series and shunt TFR components of FIG. 4A are arranged. Specifically, there is illustrated top electrodes of series TFR elements 310, 320, 330 and 340, as well as top metal electrodes of shunt TFR elements 350 and 360. The series and shunt TFR components share common bottom electrodes 370 and 380, respectively. Interposed between these sets of electrodes is a piezoelectric material such as AlN. The TFR filter illustrated in FIG. 4B has a material thickness or acoustic cavity size (the area of piezoelectric material between the top and bottom metal electrodes) that is equal for each of the series and shunt TFR components which make up the filter. The ladder filter illustrated in FIGS. 4A and 4B is a T-cell ladder filter, formed by chaining together ("concatenating") a plurality of T-Cells. However, any shunt-series, series-shunt or other structural arrangement of thin film resonators may form a bulk acoustic device such as a TFR filter, and may be modified or fabricated by the following technique below.

As discussed above, to make a bandpass filter, rather than down-shifting the resonant frequency set of the shunt TFR components by adding a metal material to the shunt TFR component's top electrode, the resonant frequency of the series TFR component may be up-shifted by removing material from these components. This may be accomplished from a carefully-controlled etching process which would remove a prescribed about of resonator material, in essence decreasing the thickness of the resonant cavity and thereby increasing the resonant pole and zero frequencies of the series TFR elements. The piezoelectric material is preferably removed from the area where the electrodes of the series TFR components will be formed. However, piezoelectric material may be removed from other areas surrounding the series TFR components of the filter, except for that area of piezoelectric material interposed between the electrodes of a shunt TFR component. It should again be stated that this method of fabricating differing frequency resonators on a single substrate is useful in many filtering applications requiring a multiplicity of frequencies. The bandpass filter is being used as an example.

Figure 5:
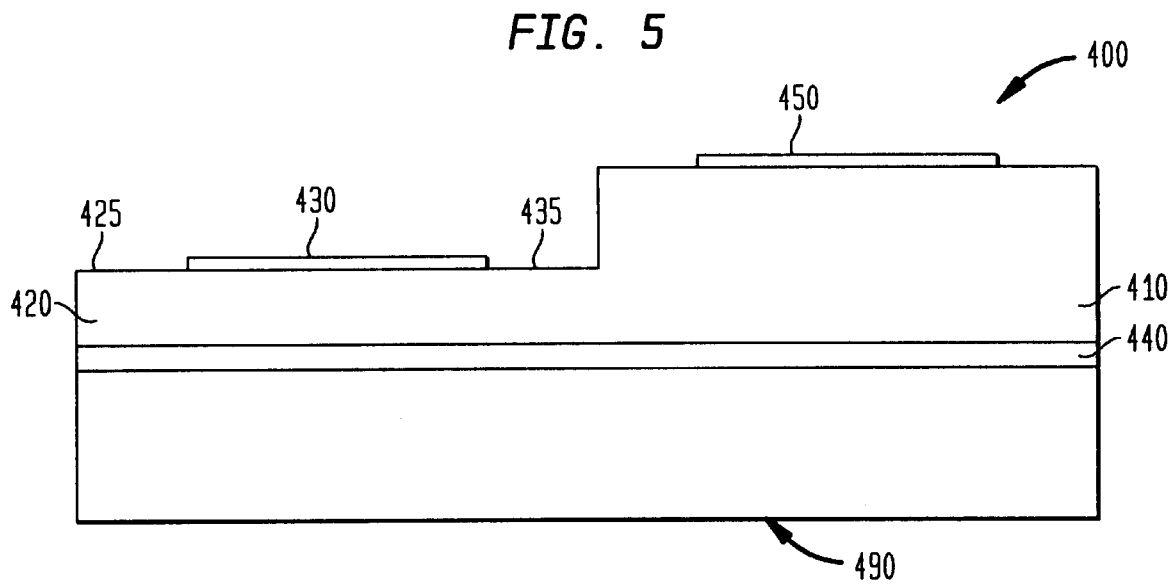
FIG. 5 illustrates a lateral view of a TFR filter in accordance with the present invention.

FIG. 5 illustrates a lateral view of a TFR filter in accordance with the present invention, after removing piezoelectric material from between the top and bottom electrodes of a series TFR component. As shown in FIG. 5, a TFR filter 400 comprises at least a series TFR resonator 420 and a shunt resonator 410. As indicated by the dotted lines, the thickness of the piezoelectric material between electrodes 430 and 440 of series resonator 420 has been reduced, with respect to that thickness between electrodes 450 and 440.

This can be done in a reactive ion etch (RIE) machine which is used in thin-film processing, for example. This machine may preferably use chlorine-based gas chemistry and a plasma bombardment to remove the desired amount of material. The rate at which material is to be removed may be accurately determined from a prior calibration sequence. Initially, piezoelectric material is deposited onto bottom electrode 440. This deposition may preferably be performed in a vacuum chamber using one of a variety of thin-film deposition techniques which are known in the art.

In order to up-shift the frequency of only the series element 420, the region which encompasses the shunt resonator 410 is masked with a material that is resistant to etching. This material may preferably be photo resist, for example. Conventional photolithography, like that used to make integrated circuits, may be used to position the photo resist accordingly, allowing for the selective removal of material where desired. In this case, the material removed is from the series TFR component 420 (the region of the piezoelectric material which was not subject to the masking process). However, as noted above, other areas of piezoelectric material surrounding the series TFR component 420 can also be removed by this process, as illustrated by areas 425 and 435 on die 490 in FIG. 5. Thus, only that area of piezoelectric material that is interposed between the electrodes of the shunt TFR component 410 (depicted by vertical dotted-lines) is not subject to the etching process. After the etching has removed the amount of material needed to up-shift the series element to the desired frequency, the photo resist may be removed by a suitable solvent. These processes are all performed before top electrodes 430 and 450 are added by the deposition and lithographic patterning process described above.

Therefore, the method in accordance with the present invention provides a technique of tuning a TFR filter by shifting the set of resonant frequencies of TFR components in the series branch of the filter. In the conventional method which adds unlike material to shift the resonant frequencies of the shunt TFR components, there is observed a marked deterioration in the shunt TFR's performance. The technique in accordance with the present invention would alternatively remove piezoelectric material to achieve the frequency up-shift of the series TFR components, avoiding the undesired addition of material needed to downshift the shunt TFR.

As described above, the current method of shifting resonant frequency sets of TFR components is to add non-piezo material (such as a metal, for example) to the top electrode of the shunt TFR component, to thereby increase cavity thickness and down-shift the resonant frequency set thereof. However, using metal to shift frequency is disadvantageous, since adding metal or other material that is not piezoelectric can detrimentally reduce the separation of the pole and zero frequencies such that it may limit the maximum bandwidth of filters made from these structures. Also, metals are known to attenuate acoustic waves more than the insulating piezoelectric material, so it is desirable to minimize the fractional amount of metal in a resonator. Accordingly, a TFR filter manufactured with desirable bandpass response characteristics and shape may be attainable by adding piezoelectric material to the shunt branch TFR components.

Figure 1:
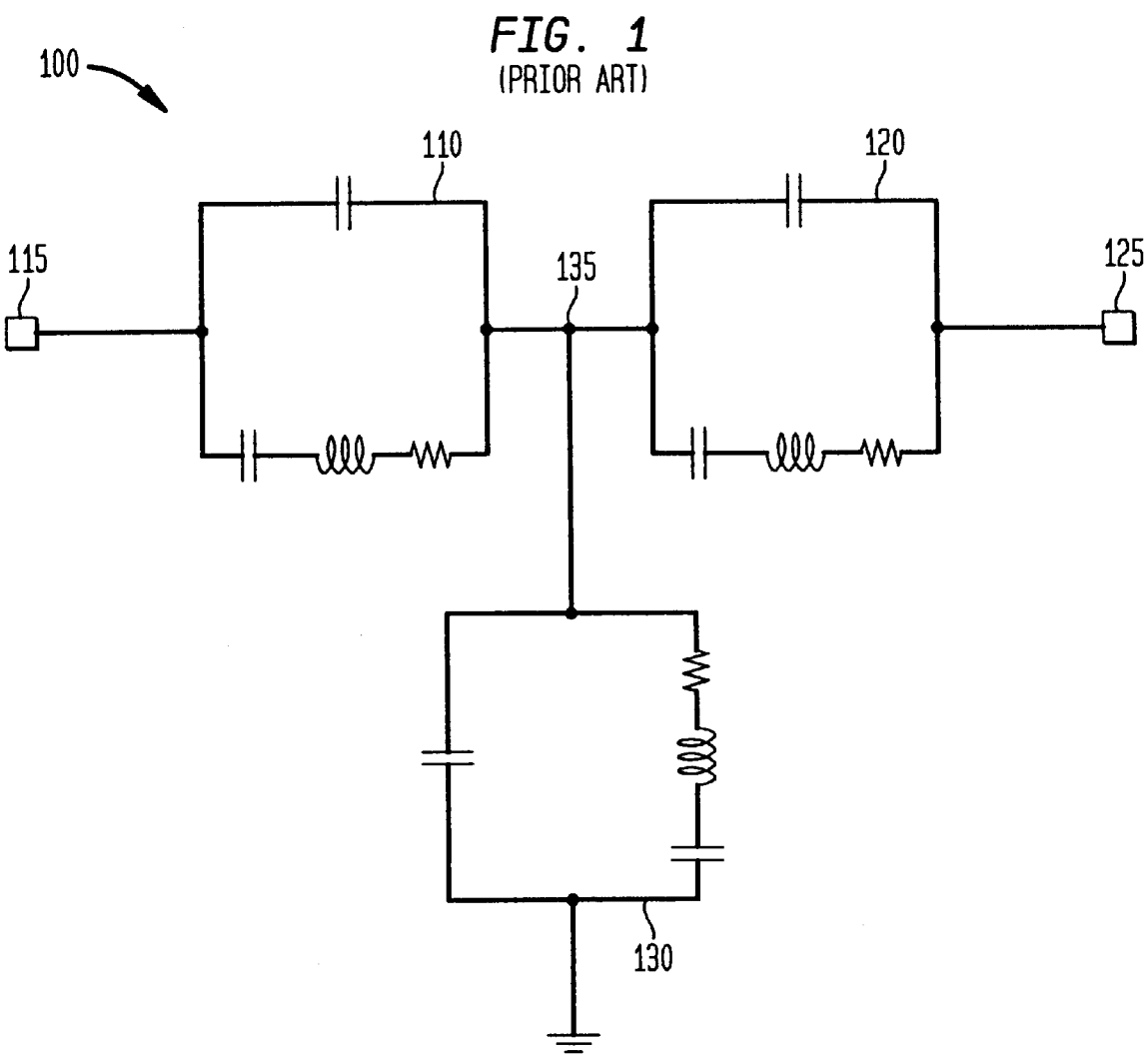
FIG. 1 illustrates a conventional schematic view of a T-Cell building block.
Figure 2A:
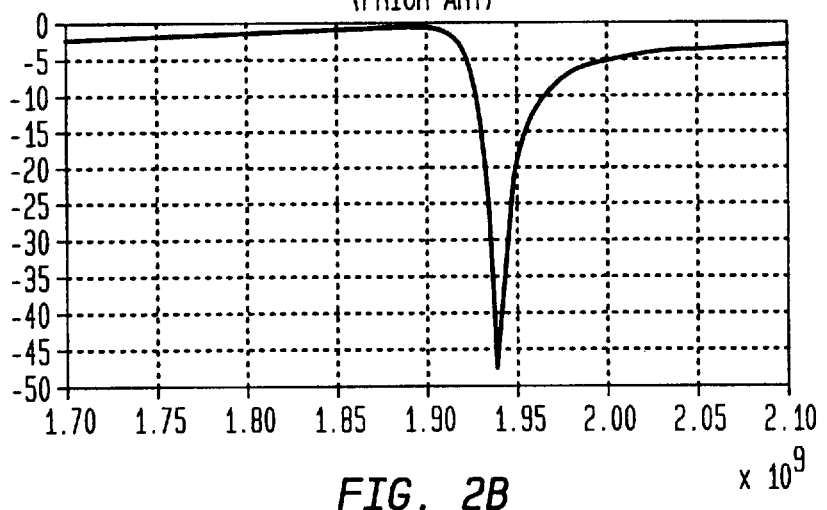
FIG. 2A illustrates the passband insertion loss response for a series configured TFR component.
Figure 2B:
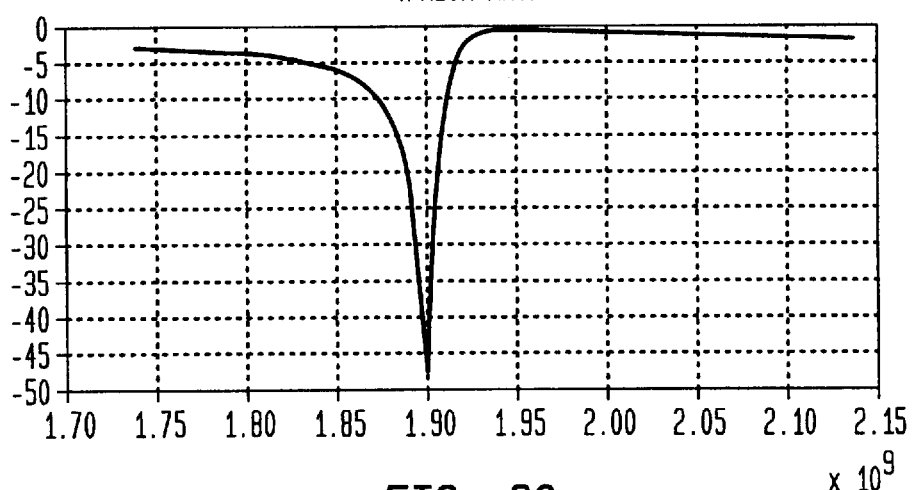
FIG. 2B illustrates the passband insertion loss response for a shunt configured TFR component.
Figure 2C:
FIG. 2C illustrates transmission characteristics for a TFR bandpass filter.
Figure 3:
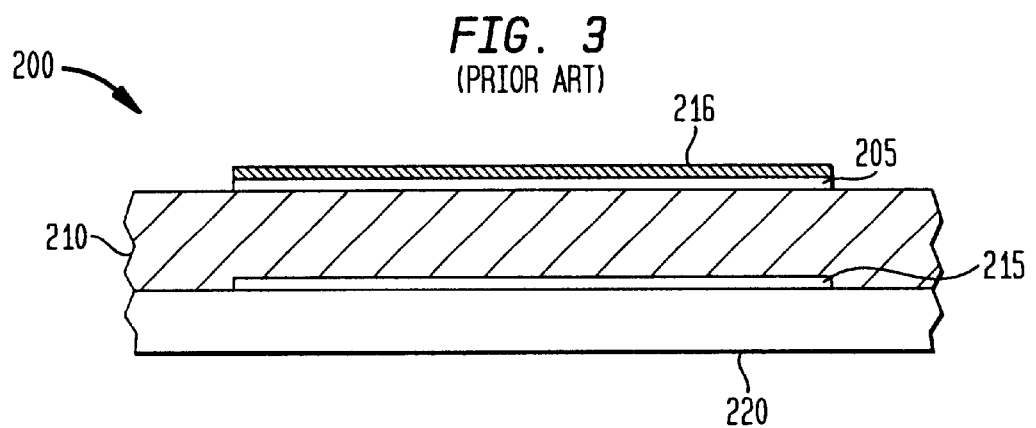
FIG. 3 illustrates a cross-section of a typical TFR component.
Figure 6:
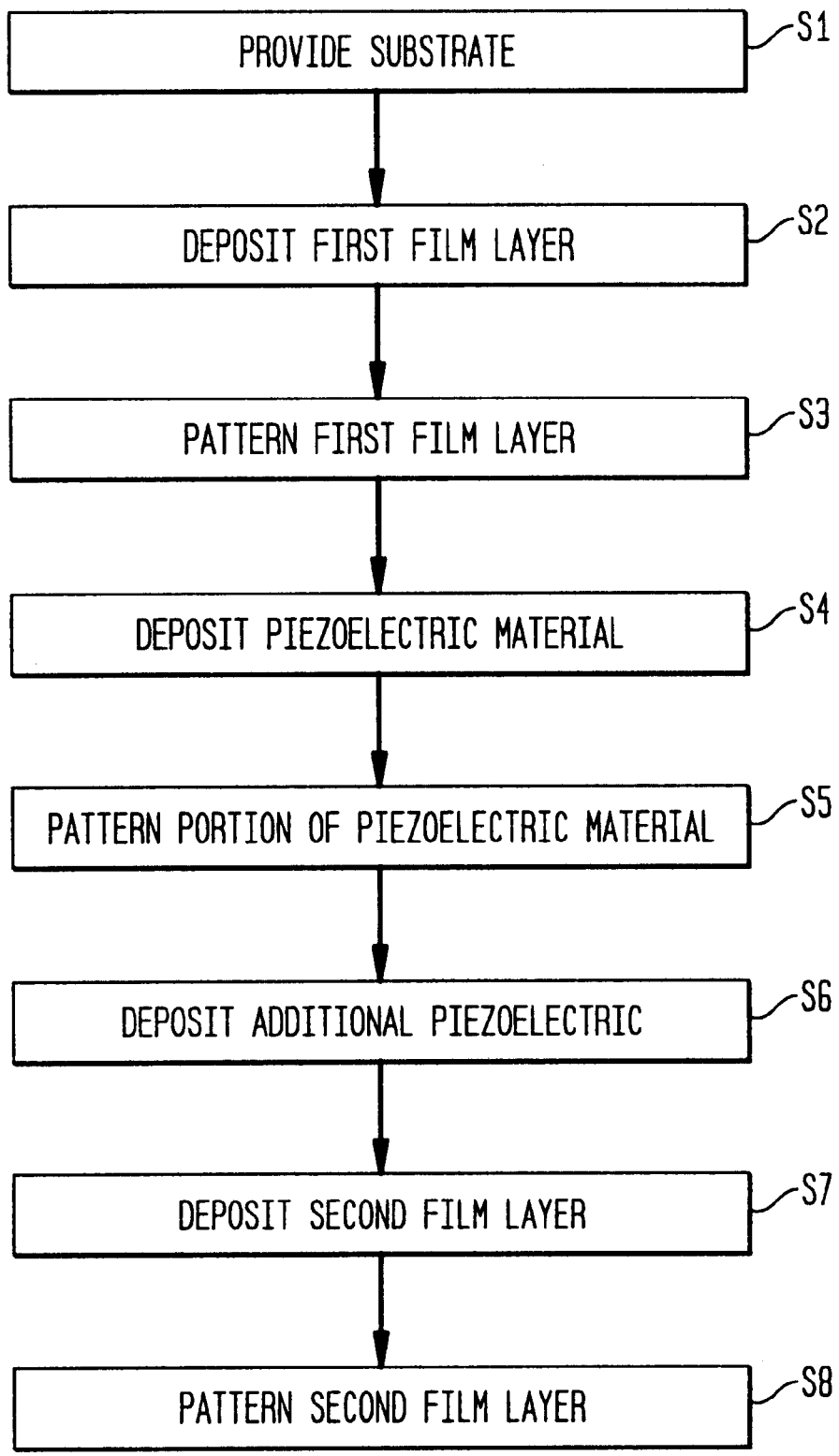
FIG. 6 illustrates a method for shifting resonant frequency sets of shunt TFR components of a TFR filter.

FIG. 6 illustrates a process by which piezoelectric material may be added to a shunt TFR component in forming a TFR filter. Initially a base support structure such as a substrate is provided (Step SI). In this case, the base structure is not integral to device operation; it primarily provides mechanical support. The base structure may be a silicon wafer substrate, and preferably may include a plurality of alternating acoustic reflecting layers of acoustically mismatched materials such as $SiO_2$ and AlN which are mounted on a solid substrate such as a silicon, quartz, or glass wafer, as described earlier regarding FIG. 3. Further, the substrate may be a membrane which is fabricated by removal of the material beneath it.

After providing the substrate, a thin metal film layer (approximately 100 nanometers or $100 \times 10^{-9}$ meters thick) is deposited on the substrate surface (Step S2). The metal film will be the bottom surface electrode which is common to the series and shunt TFR component and is preferably composed of Al, but other conductors may be used as well. This deposition may preferably be performed in a vacuum chamber using one of a variety of thin-film deposition techniques which are known in the art, such as RF sputtering, DC sputtering of a metallic target, electron beam deposition, etc.

Once the metal film has been deposited, it undergoes a patterning process (Step S3). A lithographic process is employed in which a thin layer of a photo-sensitive, chemically-resistant polymer, or "photo resist", is applied to completely coat the metal film. Exposure to light through a "photo mask", a material or masking layer that has holes or openings at certain locations for light to pass, sensitizes the photo resist such that subsequent immersion in a developer removes only that resist material that was subject to the light. At this point, the sample surface consists of regions where the protective resist layer remains, and regions of unprotected metal.

The patterning process continues with the transfer of this lithographically-defined pattern into the metal layer via an etching process. A number of etching techniques are routinely practiced in the art, including wet chemical etching, reactive ion etching (RIE), and sputter etching. Such processes, through either chemical or physical action, remove any metal which is unprotected by the photo resist, while leaving the resist-coated metal intact, thereby "sculpting" the metallic surface into the desired electrode pattern. When the remaining photo resist material is removed by a solvent, a metallic layer defined by the desired pattern remains.

The semi-completed device is then returned to the vacuum chamber for the deposition of an active piezoelectric material layer (Step S4). Similar to the metal deposition alternatives listed above, the piezoelectric layer can be deposited in different ways, such as through RF sputtering of an insulating target, pulsed DC reactive sputtering of a metallic target, chemical vapor deposition (CVD) and molecular beam epitaxy (MBE) for example. The material is grown so that it is evenly deposited on top of the bottom electrode and substrate.

After growth of the piezoelectric is completed and following removal from the vacuum chamber, a portion of the piezoelectric material surface is patterned by the aforementioned lithographic process (Step S5). In this case, this protected area is where the top electrode for the shunt TFR component will be eventually formed. After patterning of the surface, the semi-completed filter is returned to the vacuum chamber for further growth of piezoelectric on the patterned portion corresponding to the eventual shunt TFR component (Step S6), thereby increasing the thickness of the piezoelectric material within the partially-formed shunt TFR component. Subsequently, the photo resist is removed by a solvent, leaving the newly deposited piezoelectric material only in the shunt area with a slightly increased thickness (a few tens of nanometers).

Finally, the piezoelectric is coated with a second thin metal film layer of Al which forms the top electrode of the shunt TFR component (Step S7). This second metal film is patterned and etched (Step S8) with the lithographic process described above. Once the photo resist is removed, the resultant structure is that of a TFR filter where piezoelectric material has been added only to the shunt TFR component, providing the down-shifting aspect of its resonant frequency set with respect to the series TFR component. Therefore, this technique adds piezoelectric material to achieve the downshift in resonant frequencies of the shunt TFR components, while avoiding the undesirable effects inherent in adding metal material to the top electrode of the shunt TFR component.

The method in accordance with the present invention may also be utilized in forming bandstop filters from TFR components. In an alternative embodiment, the aforementioned method of removing piezoelectric material can be applied to the TFR components in the shunt branch of a prospective filter. Specifically, in fabricating a bandstop filter where all TFR components have a set of resonant frequencies at an equal or global starting value, the thickness of the piezoelectric material between electrodes of the shunt TFR components can be reduced so as to up-shift the resonant frequency sets therein, as compared to the resonant frequency sets of the series branch TFR components. The same method outlined in the discussion of FIG. 5 is relevant to forming a bandstop filter, with the roles of the series and shunt elements reversed. The bandstop filter's performance benefits similarly to that of the bandpass filter by avoiding the addition of any extra material to any elements to necessarily differentiate the frequencies.

The invention being thus described, it will be obvious that the same may be varied in many ways. Although the technique of shifting the series TFR component's resonant frequencies has been illustrated with respect to T-cell bandpass filters, this technique may also be applied to Chebychev-like ladder filters by sculpting the piezoelectric surfaces of the filter. Specifically, classic design techniques for ladder filters using lumped elements involve chaining together a number of individual filters of slightly varying resonance frequencies to achieve the desired filter characteristics, as described for example in co-pending U.S. patent application Ser. No. 09/497,860, entitled "Thin Film Resonator Filter", which is commonly assigned and concurrently filed with the present application. Utilizing the selective etching or piezoelectric sculpting techniques of the present invention, a plurality of thin film resonator T-cells of slightly varying frequency may be chained together to achieve the desirable filter characteristics of Chebychev-like ladder filters.

Similar to ladder filters, it is clear to those skilled in the art that lattice filters also require resonators of differing frequencies. Thus, the advantages discussed with regard to ladder filters also may apply to lattice filter structures. Such variations are not to be regarded as a departure from the spirit and scope of the invention, and also to modifications as would be obvious to one skilled in the art or intended to be included within the scope of the following claims.

What is claimed is:

1. A method of tuning a thin film resonator (TFR) filter formed from a plurality of TFR components coupled in series and shunt branches, wherein each of said plurality of TFR components has a set of resonant frequencies, comprising:

shifting the set of resonant frequencies of TFR components in the series or shunt branches by removing piezoelectric material from the series branch TFR components to up-shift their set of resonant frequencies with respect to resonant frequencies of said shunt branch TFR components, or by adding piezoelectric material to the shunt branch TFR components to downshift their set of resonant frequencies with respect to resonant frequencies of said series branch TFR components.

2. The method of claim 1, wherein said step of removing further includes selectively etching piezoelectric material from the series branch TFR components to reduce TFR component thickness.

3. The method of claim 2, wherein said step of selective etching produces the desired shape of the filter's bandpass response.

4. The method of claim 1,
wherein each of said TFR components is formed by interposing piezoelectric material between electrodes on a die, and
wherein said step of shifting further includes removing piezoelectric material from regions which will form the series TFR components and/or said die, excluding that piezoelectric material in regions which will form said shunt TFR components.

5. A method of tuning thin film resonator (TFR) filters formed from a plurality of TFR components that are manufactured using thin film techniques on a single substrate and coupled in a network, wherein each of said plurality of TFR components are fabricated with a required set of differing resonant frequencies to provide a filtering function by increasing the resonant frequency sets of certain TFR components from a global starting value, said step of increasing effected by selectively etching piezoelectric material from said certain TFR components to reduce TFR component thickness, said removal of piezoelectric material up-shifting the resonant frequency sets of certain TFR components having said reduced component thickness with respect to resonance frequency sets of other TFR components in the filters.

6. The method of claim 5, wherein said plurality of TFR components are coupled in series and shunt branches of the filter to form said network.

7. A method of tuning a ladder filter formed from a plurality of connected thin film resonator (TFR) T-cells, each T-Cell containing a plurality of TFR components coupled in series and shunt branches, each of said TFR components having a set of resonant frequencies, comprising:
shifting the set of resonant frequencies of TFR components in the series branches of the T-Cells upward with respect to resonant frequencies in the shunt branch TFR components by removing piezoelectric material from a surface of the series branch TFR components.

8. The method of claim 7, wherein said step of removing further includes selectively etching piezoelectric material from the series branch TFR components to reduce TFR component thickness.

9. The method of claim 8, wherein said step of selective etching produces the desired shape of the ladder filter's bandpass response.

10. The method of claim 7,
wherein each of said TFR components is formed by interposing piezoelectric material between electrodes on a die, and
wherein said step of shifting further includes removing piezoelectric material from regions which will form the series TFR components and/or said die, excluding that piezoelectric material in regions which will form shunt TFR components.

11. A method of tuning a thin film resonator (TFR) filter formed from a plurality of TFR components coupled in series and shunt branches, wherein each of said plurality of TFR components has a set of resonant frequencies, comprising:
shifting the set of resonant frequencies of TFR components in the shunt branches up with respect to the set of resonant frequencies of said series branch TFR components in the filter by removing piezoelectric material from a surface of the shunt branch TFR components.

12. The method of claim 11 wherein said step of removing piezoelectric material further includes selectively etching piezoelectric material from the shunt branch TFR components to reduce TFR component thickness.

13. The method of claim 12, wherein said step of selective etching produces the desired shape of the filter's bandstop response.

14. The method of claim 11,
wherein each of said TFR components is formed by interposing piezoelectric material between electrodes on a die, and
wherein said step of shifting further includes removing piezoelectric material from regions which will form the shunt TFR components and/or said die, excluding that piezoelectric material in regions which will form the series TFR components.

15. A method of tuning a thin film resonator (TFR) filter formed from a plurality of TFR components coupled in series and shunt branches, each of said plurality of TFR components including a layer of piezoelectric material interposed between two electrodes, and each TFR component having a set of resonant frequencies, comprising:
shifting the set of resonant frequencies of TFR components in the shunt branches of the filter down with respect to the series branch TFR components by depositing additional piezoelectric material in a region which forms the shunt branch TFR components.

16. A method of tuning a lattice structure formed from a plurality of connected thin film resonator (TFR) T-cells, each T-Cell containing a plurality of TFR components coupled in series and shunt branches, each of said TFR components having a set of resonant frequencies, comprising:
shifting the set of resonant frequencies of TFR components in the series branches of the T-Cells up with respect to resonant frequencies in shunt branch TFR components by removing piezoelectric material from a surface of the series branch TFR components.

17. The method of claim 16 wherein said step of removing further includes selectively etching piezoelectric material from the series branch TFR components to reduce TFR component thickness.

18. The method of claim 17, wherein said step of selective etching produces the desired shape of the lattice structure's bandpass response.

19. The method of claim 16, wherein each of said TFR components is formed by interposing piezoelectric material between electrodes on a die, and
wherein said step of shifting further includes removing piezoelectric material from regions which will form the series TFR components and/or said die, excluding that piezoelectric material in regions which will form shunt TFR components.

* * * * *